United States Patent
Kajiwara et al.

(10) Patent No.: US 10,103,023 B2
(45) Date of Patent: Oct. 16, 2018

(54) SEMICONDUCTOR DEVICE FABRICATION METHOD

(71) Applicant: FUJI ELECTRIC CO., LTD., Kawasaki-shi, Kanagawa (JP)

(72) Inventors: Satomi Kajiwara, Matsumoto (JP); Shin'ichi Nakamata, Matsumoto (JP)

(73) Assignee: FUJI ELECTRIC CO., LTD., Kawasaki-Shi, Kanagawa (JP)

( * ) Notice: Subject to any disclaimer, the term of this patent is extended or adjusted under 35 U.S.C. 154(b) by 0 days.

(21) Appl. No.: 15/291,487

(22) Filed: Oct. 12, 2016

(65) Prior Publication Data
US 2017/0140935 A1    May 18, 2017

(30) Foreign Application Priority Data
Nov. 16, 2015 (JP) ................................. 2015-223702

(51) Int. Cl.
| | | |
|---|---|---|
| *H01L 21/02* | (2006.01) | |
| *H01L 21/033* | (2006.01) | |
| *H01L 21/04* | (2006.01) | |
| *H01L 23/373* | (2006.01) | |

(52) U.S. Cl.
CPC .... *H01L 21/0465* (2013.01); *H01L 21/02164* (2013.01); *H01L 21/02236* (2013.01); *H01L 21/02255* (2013.01); *H01L 21/0332* (2013.01); *H01L 23/3731* (2013.01)

(58) Field of Classification Search
None
See application file for complete search history.

(56) References Cited

U.S. PATENT DOCUMENTS

| | | | | |
|---|---|---|---|---|
| 2004/0065961 | A1* | 4/2004 | Funakoshi | ...... H01L 21/823871 257/774 |
| 2006/0063342 | A1* | 3/2006 | Fujikawa | ............. H01L 21/046 438/369 |
| 2011/0143093 | A1* | 6/2011 | Kusunoki | ............. B82Y 30/00 428/141 |
| 2014/0251375 | A1* | 9/2014 | Holden | ............ H01L 21/02076 134/7 |

FOREIGN PATENT DOCUMENTS

JP    2006-324585 A    11/2006

* cited by examiner

*Primary Examiner* — Jay C Chang
(74) *Attorney, Agent, or Firm* — Rabin & Berdo, P.C.

(57) ABSTRACT

With a semiconductor device fabrication method, an oxide film and a thermal oxide film formed over a semiconductor substrate are etched and ions are implanted in the semiconductor substrate in a high-temperature environment with the etched oxide film as a mask. Furthermore, the thermal oxide film has high adhesion to the semiconductor substrate. As a result, even if a difference in linear expansion coefficient arises between the semiconductor substrate and the oxide film due to a change in the linear expansion coefficient of the semiconductor substrate, the oxide film does not peel off the semiconductor substrate or crack because the oxide film is formed over the semiconductor substrate with the thermal oxide film therebetween.

10 Claims, 5 Drawing Sheets

|   | ADHESION FILM (THERMAL OXIDE FILM) | OXIDE FILM | PEELING OR CRACK |
|---|---|---|---|
| 1 | 2nm | 0.5 μm | ○ |
| 2 | 2nm | 3 μm | ○ |
| 3 | 2nm | 4 μm | △ |
| 4 | 10nm | 1.5 μm | ○ |
| 5 | 10nm | 3 μm | ○ |
| 6 | 0nm | 1 μm | × |
| 7 | 0nm | 3 μm | × |

SEMICONDUCTOR DEVICE FABRICATION METHOD

CROSS-REFERENCE TO RELATED APPLICATION

This application is based upon and claims the benefit of priority of the prior Japanese Patent Application No. 2015-223702, filed on Nov. 16, 2015, the entire contents of which are incorporated herein by reference.

BACKGROUND OF THE INVENTION

1. Field of the Invention

Embodiments discussed herein relate to a semiconductor device fabrication method.

2. Background of the Related Art

In recent years semiconductor substrates made of silicon carbide (SiC) have been used in place of semiconductor substrates made of silicon (Si) in order to realize high performance semiconductor devices.

Ion implantation is performed in processes for fabricating such semiconductor devices in order to electrically arrange functional regions by implanting impurities and realize operation as a semiconductor device. However, simply performing ion implantation causes a crystal defect or creates an amorphous region in which crystallinity is degraded. As a result, a function as a semiconductor device may not be fully realized. Therefore, there is a need to perform heat treatment on a crystal defect caused by ion implantation or an amorphous region in which crystallinity is degraded by ion implantation. By doing so, crystallinity is recovered and electrical activation is performed. If silicon carbide is used, it is difficult for impurities to diffuse. In addition, silicon carbide has polytypes (crystal polymorphism) which differ in physical property such as forbidden band width or impurity level. In order to prevent a polytype from mingling and realize good recrystallization, ion implantation is performed in a high-temperature environment compared with silicon. Therefore, for example, a heat-resistant oxide film is used as a mask film in place of photoresist used in the case of silicon (see, for example, Japanese Laid-open Patent Publication No. 2006-324585).

By the way, in order to reduce the costs of semiconductor device fabrication, a large-diameter semiconductor wafer is used. By doing so, the number of semiconductor chips obtained is increased.

Furthermore, with semiconductor elements, such as an insulated gate bipolar transistor (IGBT), in which current flows in the vertical direction, there is a need to make a semiconductor wafer thin for maintaining or improving the performance.

However, if ion implantation is performed on a thin large-diameter semiconductor wafer (semiconductor substrate) made of silicon carbide in a high-temperature environment by the use of a silicon oxide film or the like formed by a chemical vapor deposition (CVD) method or the like as a mask film, the mask film cracks or peels. A semiconductor substrate made of silicon carbide or the like and an oxide film differ in linear expansion coefficient. Residual stress is created in a stage in which the oxide film has been formed and patterned. When they are heated at a high temperature (300° C. to 500° C.) at ion implantation time, a mask film, which is the oxide film or the like, cracks or peels or a crack appears or peeling occurs at an interface between the mask film and the semiconductor substrate, because of the difference in linear expansion coefficient between silicon carbide and the oxide film. Furthermore, boron (B), aluminum (Al), phosphorus (P), nitrogen (N), arsenic (As), and the like are implanted in a semiconductor substrate made of silicon carbide or the like. As a result, a region in which ions are implanted and a region in which ions are not implanted differ in linear expansion coefficient. Accordingly, stress also acts on a mask film which is an oxide film or the like, which is formed over the semiconductor substrate, and which is patterned. As a result, the mask film cracks or peels.

Furthermore, in order to reduce crack formation or peeling, the thickness of the oxide film may be decreased. However, if silicon carbide is used, it is difficult for impurities to diffuse. Accordingly, there is a need to implant impurities more deeply at energy higher than acceleration energy for ion implantation used for conventional silicon semiconductor devices. In this case, it is desirable that the thickness of the mask film, which is a silicon oxide film or the like, be at least 0.5 to 3 μm. It is desirable not to reduce the thickness of the mask film beyond this limit.

Therefore, because of thermal stress created due to the difference in linear expansion coefficient between the semiconductor substrate and the oxide film, the oxide film peels off the semiconductor substrate or a crack or the like appears in the oxide film. As a result, the oxide film does not function as a mask film. Accordingly, ion implantation is not performed properly on the semiconductor substrate and the characteristics of a semiconductor device may deteriorate.

Furthermore, if a large-diameter semiconductor wafer, more particularly a semiconductor wafer having a diameter of 4 inches or more is used, these problems become significant.

SUMMARY OF THE INVENTION

According to one aspect of the invention, there is provided a semiconductor device fabrication method including forming an adhesion film over a semiconductor substrate made of a wide-band-gap semiconductor, forming an oxide film over the adhesion film, forming a patterned mask film over the oxide film, etching the oxide film and the adhesion film with the mask film as a mask, and implanting ions in the semiconductor substrate in a high-temperature environment with the etched oxide film as a mask.

The object and advantages of the invention will be realized and attained by means of the elements and combinations particularly pointed out in the claims.

It is to be understood that both the foregoing general description and the following detailed description are provided by way of example and explanatory and are not restrictive of the invention.

DETAILED DESCRIPTION OF THE INVENTION

An embodiment will now be described with reference to the accompanying drawings.

Main processes of a semiconductor device fabrication method will be described by the use of FIG. 1.

Figure 1:
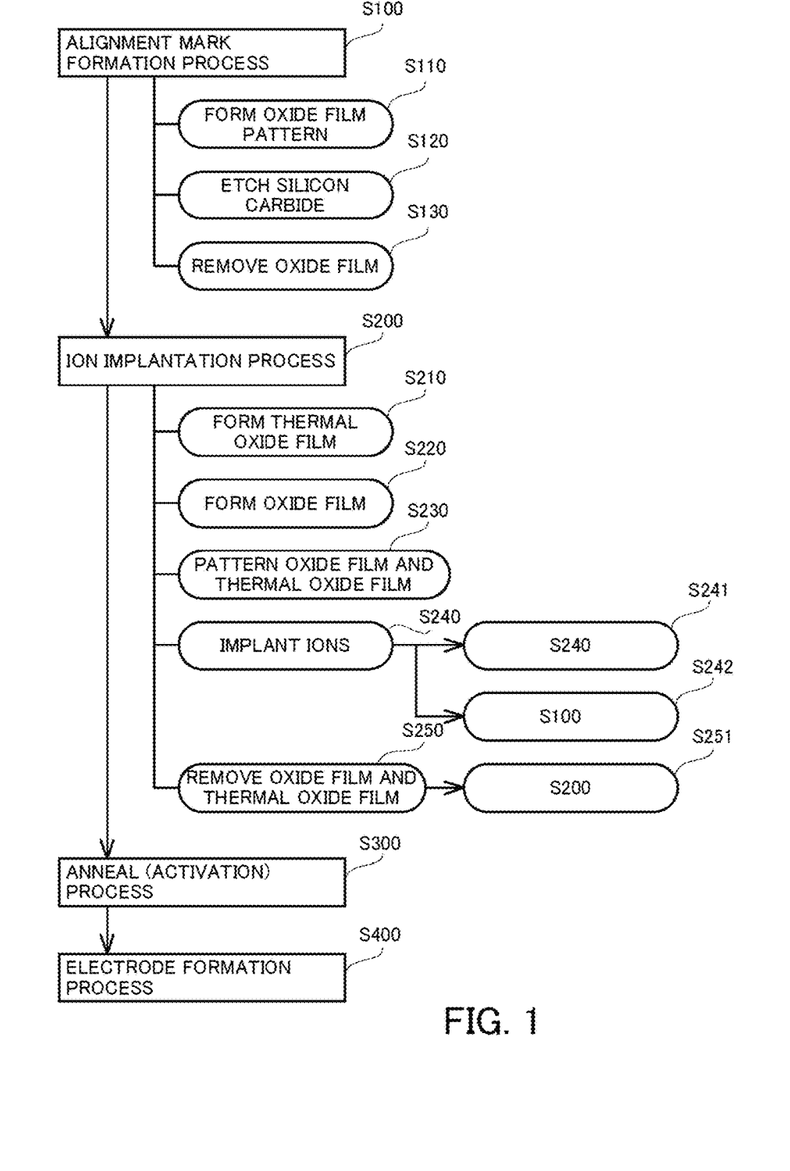
FIG. 1 is a flow chart indicative of a semiconductor device fabrication method according to an embodiment.

FIG. 1 is a flow chart indicative of a semiconductor device fabrication method according to an embodiment.

First a semiconductor wafer (semiconductor substrate) made of silicon carbide is prepared. A Si surface or a carbon (C) surface of this semiconductor wafer may be considered as a front surface. The front surface is a principal plane of a semiconductor device in which local doping is performed for forming, for example, a source region and a well region of a field-effect transistor.

As stated above, with the semiconductor wafer made of silicon carbide, it is difficult for impurities to diffuse. In addition, a crystal polymorphism which differs in physical property tends to mingle. Therefore, ion implantation is performed at a temperature of, for example, 500° C. or more in a high-temperature environment. Furthermore, this is not limited to silicon carbide. With a wide band-gap semiconductor such as gallium nitride (GaN), ion implantation is also performed in a high-temperature environment. Ion implantation will be described below. However, ion implantation temperature is not limited to the above temperature and may be 300° C. or more.

In the embodiment main processes of a semiconductor device fabrication method used for the semiconductor wafer made of, for example, silicon carbide will be described.

The flow chart of FIG. 1 will be realized by a semiconductor device fabrication apparatus.

(Step S100) An alignment mark is formed on a determined region of the front surface of the semiconductor substrate (semiconductor wafer).

The alignment mark is a stylized pattern arranged in a specified position of a component of a semiconductor device on the front surface of the semiconductor substrate for making alignment of the component of the semiconductor device for the formation of the semiconductor device easy.

The details of step S100 will be described later.

(Step S200) A mask film is formed over the semiconductor wafer on the basis of the alignment mark and ion implantation is performed on the semiconductor substrate by utilizing the mask film.

By doing so, impurities are introduced into, for example, a region of the semiconductor substrate in which a source (or an emitter) is to be formed.

The details of step S200 will be described later.

(Step S300) After the mask film is removed, the semiconductor substrate into which the impurities are introduced is annealed, for example, at a temperature of 1500° C. or more and 1800° C. or less. By doing so, the impurities introduced into the semiconductor substrate are activated and conductive regions, such as source (or emitter) regions, are formed in the semiconductor substrate.

(Step S400) Electrodes, wirings, and the like are formed in determined positions over the front surface and a back surface of the semiconductor substrate in which the conductive regions are formed.

The semiconductor substrate which has passed through the above steps S100, S200, S300, and S400 is separated with a dicer into a plurality of semiconductor chips.

The details of the alignment mark formation in step S100 will now be described again by the use of FIG. 1.

(Step S110) An oxide film, such as a silicon oxide ($SiO_2$) film, is formed by the chemical vapor deposition (CVD) method over the whole of the front surface of the prepared semiconductor substrate made of silicon carbide in which a semiconductor device structure is formed.

The diameter of the semiconductor substrate is, for example, 4 inches or more. Furthermore, the thickness of the semiconductor substrate is 350 µm or more and 500 µm or less. The thickness of the semiconductor substrate is preferably 100 µm or more and 150 µm or less.

Photoresist is formed over the oxide film and is wrought into a determined pattern by photolithography.

The oxide film is selectively removed by at least one of dry etching and wet etching with the patterned photoresist as a mask film to pattern the oxide film.

If both of dry etching and wet etching are performed, first the oxide film is removed by anisotropic dry etching, such as reactive ion etching or inductively coupled plasma etching. In order to prevent damage to the surface of the semiconductor substrate caused by plasma, at this time the dry etching is stopped just before the oxide film is completely removed. The rest of the oxide film is removed by the wet etching using a buffered hydrofluoric acid solution or the like.

After the oxide film is patterned, the photoresist is immersed in an amine-based organic solvent or a liquid mixture of sulfuric acid and hydrogen peroxide water to completely peel it from the oxide film for removal.

(Step S120) The semiconductor substrate is selectively removed by at least one of dry etching and wet etching with the oxide film patterned in step S110 as a mask film to form the alignment mark on the semiconductor substrate.

(Step S130) The semiconductor substrate on which the alignment mark is formed on the basis of the patterned oxide film is immersed in a buffer hydrofluoric acid solution to remove the patterned oxide film from the semiconductor substrate.

The alignment mark is formed in this way on the semiconductor substrate.

The details of the ion implantation in step S200 will now be described again by the use of FIGS. 1, 2A through 2C, and 3A through 3C.

FIGS. 2A through 2C and 3A through 3C illustrate the ion implantation process in the semiconductor device fabrication method according to the embodiment.

FIGS. 2A through 2C and 3A through 3C illustrate the ion implantation process performed at the time of fabricating the semiconductor device.

Figure 2A:
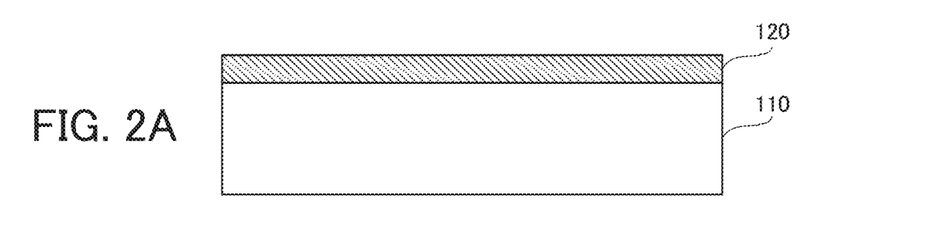
FIGS. 2A, 2B, and 2C illustrate an ion implantation process in the semiconductor device fabrication method according to the embodiment (part 1).

(Step S210) As illustrated in FIG. 2A, a thermal oxide film 120 is formed by thermal oxidation over the whole of a front surface (upper surface in FIG. 2A) of a semiconductor substrate 110 on which an alignment mark (not illustrated) is formed as an adhesion layer made of silicon oxide ($SiO_2$).

In the thermal oxidation step, the front surface of the semiconductor substrate 110 made of silicon carbide is heated at a temperature of, for example, 700° C. or more and 1100° C. or less in an atmosphere of oxygen. At this time a carbon atom goes missing at the SiC interface on the front surface of the semiconductor substrate 110 and an oxygen (O) atom joins to an exposed silicon atom. Oxygen atoms join one after another in this way to silicon atoms on the front surface side of the semiconductor substrate 110. Furthermore, internal carbon atoms go missing in order and oxygen atoms join one after another to silicon atoms. As a result, the thermal oxide film 120 made of silicon oxide is formed from the front surface side of the semiconductor substrate 110. That is to say, the thermal oxide film 120 is formed in order in the direction from the front surface side to the back surface side of silicon carbide. The thermal oxide film 120 formed in this way has high adhesion to the semiconductor substrate 110 and is highly heat-resistant. If a silicon oxide ($SiO_2$) layer is formed by, for example, the conventional CVD method, a bond between silicon carbide (SiC) and silicon oxide ($SiO_2$) is poor. Accordingly, adhesion may be low compared with the thermal oxide film 120.

The thickness of the thermal oxide film 120 is 2 nm or more and 100 nm or less. Furthermore, the thickness of the thermal oxide film 120 is preferably 5 nm or more and 10 nm or less.

Silicon carbide usually used is 4H—SiC. 4H—SiC corresponding to one lattice is oxidized. Four layers of positions occupied by three kinds of SiC pairs in a hexagonal close-packed structure correspond to a thickness of 2 nm. The thickness of a silicon oxide film corresponds to a thickness about two times the thickness of the oxidized silicon carbide film. In other words, uniform oxidation of silicon carbide is confirmed by the fact that the thickness of the thermal oxide film 120 is 2 nm. If the thermal oxide film 120 is uniformly formed, it functions as an adhesion layer. That is to say, even if the thickness of an oxide film 130 formed over the adhesion layer is 0.5 μm or more and 3 μm or less, its adhesion as a mask film is not marred. In addition, if the thickness of the oxide film 130 is 5 nm or more, it has higher adhesion.

If the thickness of the thermal oxide film 120 is 2 nm or more, it is possible to confirm by a transmission electron microscope (TEM) sectional image that the thermal oxide film 120 is a continuous film.

Time taken to form the thermal oxide film 120 having a thickness of 10 nm is 2 hours or more and 3 hours or less (about 30 minutes for oxidation and time for raising and lowering temperature). This thickness is effectively desirable. That is to say, a thickness of 5 nm or more and 10 nm or less is more desirable to combine productivity and adhesion.

Furthermore, time taken to form the thermal oxide film 120 having a thickness of 100 nm is 12 hours or more and 24 hours or less (10 hours or more and 20 hours or less for oxidation and time for raising and lowering temperature). If the thickness of the thermal oxide film 120 exceeds 100 nm, then the oxidation rate becomes low and the productivity declines. As will be described later, a silicon oxide film having a thickness of 0.5 μm or more and 3 μm or less is needed as a mask at the time of ion implantation. However, it is not realistic to form a silicon oxide film having this thickness by thermal oxidation. The reason for this is that it takes a very long time to perform a process.

The thermal oxide film 120 is not limited to a silicon oxide film or a film formed by thermal oxidation. That is to say, the thermal oxide film 120 is a film having high adhesion to the semiconductor substrate 110. For example, a silicon nitride ($Si_3N_4$) film or the like formed by nitriding treatment is possible as such a film.

Figure 2B:
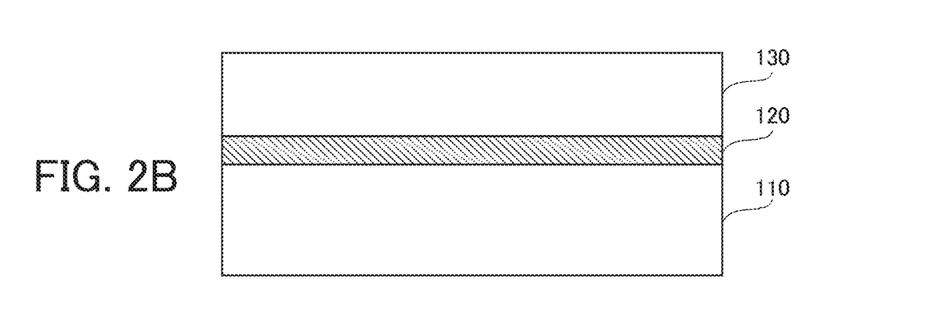

(Step S220) As illustrated in FIG. 2B, the oxide film 130 made of silicon oxide is formed by the CVD method over a front surface of the thermal oxide film 120 formed over the semiconductor substrate 110. The oxide film 130 may be formed by a deposition method or a sputtering method.

The thickness of the oxide film 130 depends on ion implantation conditions. However, the thickness of the oxide film 130 is preferably about 0.5 μm or more and about 3 μm or less.

For example, if acceleration energy at the time of ion implantation is 300 KeV or more and 400 KeV or less, then the oxide film 130 having a thickness of at least 1 μm or more and 1.5 μm or less is needed for making the oxide film 130 function as a mask. If acceleration energy is 100 KeV, then the oxide film 130 having a thickness of at least about 0.5 μm is needed for making the oxide film 130 function as a mask. If the thickness of the oxide film 130 is less than 0.5 μm, implanted ions pass through the oxide film 130.

Strictly speaking, the thickness of a mask for ion implantation is the total thickness of the adhesion layer (thermal oxide film 120) and the oxide film 130. However, the thermal oxide film 120 is sufficiently thin compared with the oxide film 130. Therefore, the thickness of the oxide film 130 is stipulated as the thickness of a mask for ion implantation.

On the other hand, if the oxide film 130 is too thick, a crack tends to appear. If the oxide film 130 is too thick compared with the adhesion layer 120, residual stress stronger than the adhesion of the adhesion layer 120 may act. If a crack appears, ions may be implanted in a region other than a region in which ions are to be implanted. This may cause a breakdown voltage failure or a malfunction. Furthermore, an ion implantation angle exists at the time of ion implantation. Accordingly, if the oxide film 130 is too thick, implanted ions may be blocked by the oxide film 130 and be implanted in a region other than a region in which the ions are to be implanted. This may cause a breakdown voltage failure or a malfunction. In order to prevent these problems from arising, it is desirable that the upper limit of the thickness of the oxide film 130 be about 3 μm.

Figure 2C:
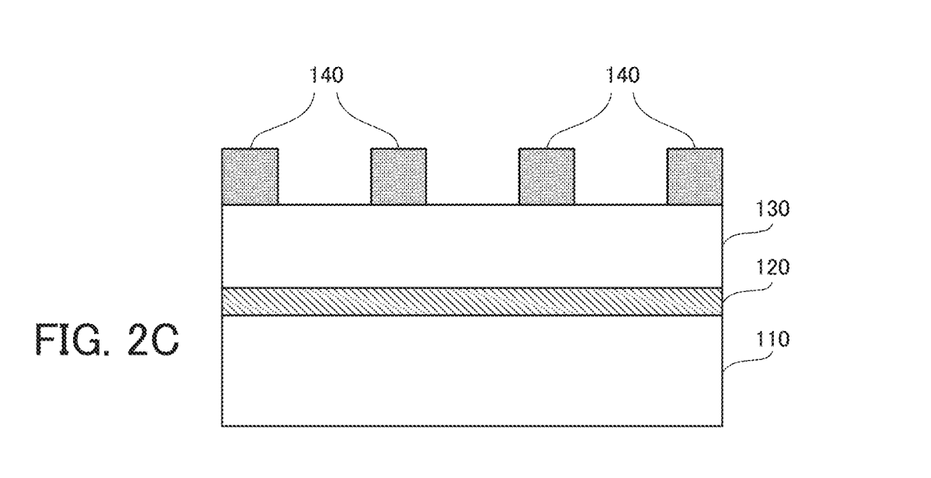

(Step S230) Photoresist is formed over the entire surface of the oxide film 130 and, as illustrated in FIG. 2C, is wrought into patterned photoresist 140 as a mask film of the oxide film 130 by the photolithography.

Figure 3A:
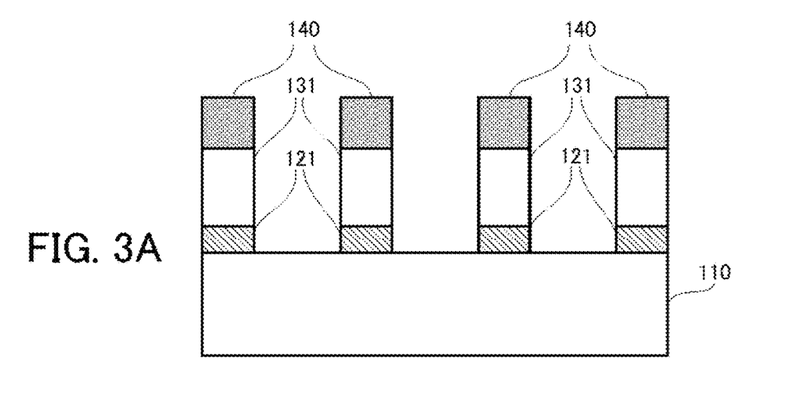
FIGS. 3A, 3B, and 3C illustrate an ion implantation process in the semiconductor device fabrication method according to the embodiment (part 2).

The oxide film 130 and the thermal oxide film 120 are selectively removed by at least one of dry etching and wet etching with the patterned photoresist 140 as a mask film. Tetrafluoromethane gas, plasma, or the like is used in the dry etching. Hydrofluoric acid, buffered hydrofluoric acid, or the like is used in the wet etching. As a result, as illustrated in FIG. 3A, a patterned oxide film 131 and a patterned thermal oxide film 121 in which ion implantation regions are exposed are obtained.

At this time the etching is performed under conditions under which the oxide film 130 and the thermal oxide film 120 are removed at the same time. This makes it possible to obtain the patterned oxide film 131 and the patterned thermal oxide film 121 without adding an etching process.

After the patterned oxide film 131 and the patterned thermal oxide film 121 are obtained, the photoresist 140 is immersed in an amine-based organic solvent or a liquid mixture of sulfuric acid and hydrogen peroxide water to completely peel it from the oxide film 131 for removal. Alternatively, the photoresist 140 may be removed by a dry method using oxygen gas and plasma.

Figure 3B:
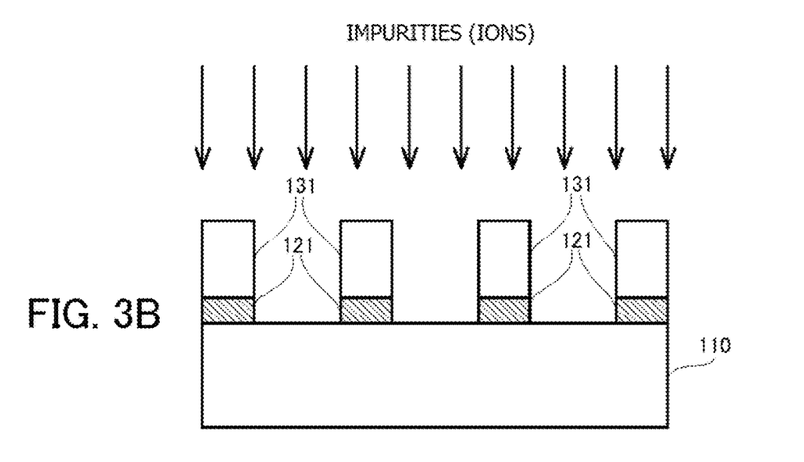

(Step S240) As illustrated in FIG. 3B, impurities (ions) are implanted in the regions in which the ions are to be implanted and which get exposed in step S230 at a temperature of 500° C. or more in a high-temperature environment with the patterned oxide film 131 as a mask.

To form an n-type conductive region, phosphorus (P), arsenic (As), or the like is used for ion implantation. To form a p-type conductive region, boron (B) or the like is used for ion implantation.

Furthermore, ion implantation conditions (acceleration energy and a dose) are properly set according to the depth of conductive regions to be formed, ion concentration in the conductive regions, and the like.

Because at this time the ions are implanted in the high-temperature environment, the linear expansion coefficient of the semiconductor substrate 110 having a thickness of 350 µm or more and 500 µm or less changes. Therefore, there is a difference in linear expansion coefficient between the semiconductor substrate 110 and the oxide film 131. However, the oxide film 131 is formed over the semiconductor substrate 110 with the thermal oxide film 121 therebetween. As stated above, the thermal oxide film 121 has high adhesion to the semiconductor substrate 110 and is highly heat-resistant. As a result, even if there is a difference in linear expansion coefficient between the semiconductor substrate 110 and the oxide film 131, the oxide film 131 does not peel off the semiconductor substrate 110 or a crack does not appear in the oxide film 131. The adhesion of the oxide film 131 to the semiconductor substrate 110 is maintained via the thermal oxide film 121. That is to say, the oxide film 131 functions as a mask film without any positional deviation from the position in which the oxide film 131 is formed over the semiconductor substrate 110. Therefore, by using the oxide film 131 as a mask film for ion implantation, the ions are properly implanted in the regions in which the ions are to be implanted.

(Step S241) Impurities are implanted in ion implantation regions of the semiconductor substrate 110 other than the regions in which the ions are implanted in step S240 in the same way that is described in step S240 with the patterned oxide film 131 as a mask film. In other words, the process described with respect to step 240 may be repeated in other areas of the semiconductor substrate 110.

Impurities are implanted in this way in all regions of the semiconductor substrate 110 in which ions are to be implanted with the patterned oxide film 131 as a mask film.

(Step S242) An alignment mark is formed in regions of the semiconductor substrate 110 other than the regions in which the ions are implanted in step S240 in the same way that is described in S100, and steps S210 through S240 are performed.

Figure 3C:
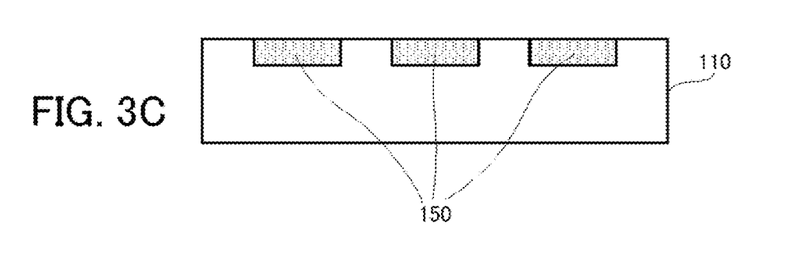

(Step S250) After the ions are implanted in step S240 in the regions of the semiconductor substrate 110 in which the ions are to be implanted, the semiconductor substrate 110 over which the patterned oxide film 131 and the patterned thermal oxide film 121 are formed is immersed in a buffered hydrofluoric acid solution. By doing so, as illustrated in FIG. 3C, the oxide film 131 and the thermal oxide film 121 are removed from the semiconductor substrate 110 in which ion implantation regions 150 are formed in the determined regions.

(Step S251) If the patterned oxide film 131 formed over the patterned thermal oxide film 121 remains over regions of the semiconductor substrate 110 other than regions over which the oxide film 131 and the thermal oxide film 121 are removed in step S250, then step S200 is performed again.

After all the above step S200 ends, an anneal process in step S300 and an electrode formation process in step S400 are performed in order.

The above semiconductor device fabrication method includes a process for forming the thermal oxide film 120 over the semiconductor substrate 110 made of silicon carbide, a process for forming the oxide film 130 over the thermal oxide film 120, a process for forming the patterned photoresist 140 over the oxide film 130, a process for etching the oxide film 130 and the thermal oxide film 120 with the photoresist 140 as a mask, and a process for implanting ions in the semiconductor substrate 110 in a high-temperature environment with the etched oxide film 131 as a mask.

Observation results of peeling of or a crack in the oxide film 131 and the thermal oxide film 121 will now be described by the use of FIG. 4.

Figure 4:
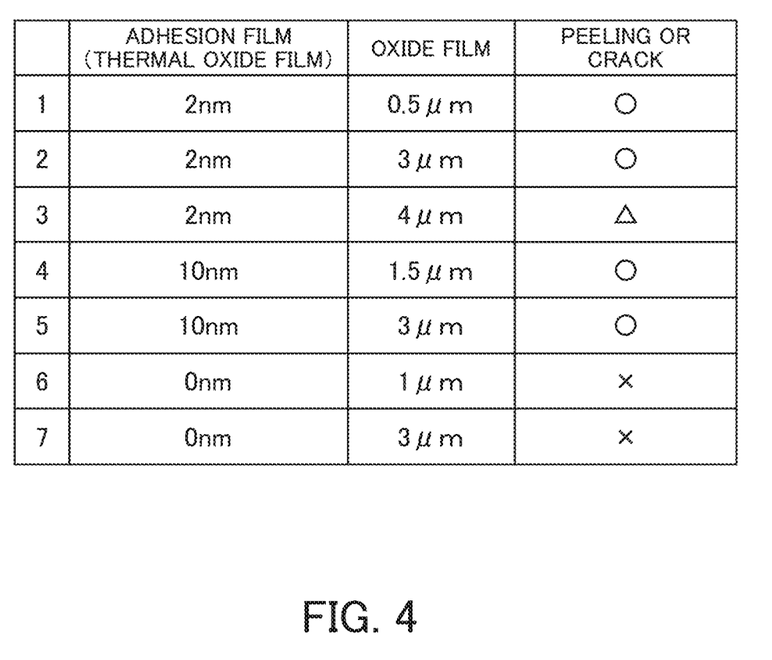
FIG. 4 is a table indicative of observation results of a thermal oxide film and an oxide film of a semiconductor device fabricated by the semiconductor device fabrication method according to the embodiment.

FIG. 4 is a table indicative of observation results of the thermal oxide film and the oxide film of a semiconductor device fabricated by the semiconductor device fabrication method according to the embodiment.

Peeling of or a crack in the thermal oxide film 121 and the oxide film 131 was observed after the ion implantation at ×500 magnification with an optical microscope and at ×5000 magnification with a scanning electron microscope (SEM). As indicated in FIG. 4, a case where peeling of the thermal oxide film 121 (adhesion film) or the oxide film 131 having each thickness was not observed is judged "○", a case where slight peeling of the thermal oxide film 121 (adhesion film) or the oxide film 131 having each thickness was observed is judged "Δ", and a case where serious peeling of the thermal oxide film 121 (adhesion film) or the oxide film 131 having each thickness was observed is judged "×". The slight peeling means that peeling of a film having a width of 5 µm or less occurs in less than five parts on a 6-inch wafer. Furthermore, as indicated in FIG. 5 described later, the serious peeling means that peeling (peeling part 131a in FIG. 5, for example) of a film having a width of 5 µm or more occurs in five or more parts on a 6-inch wafer.

Figure 5:
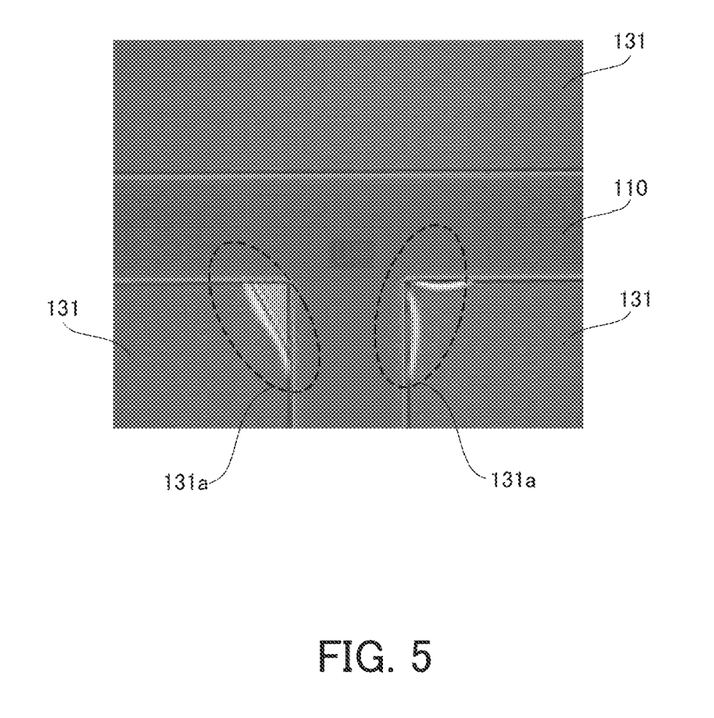
FIG. 5 indicates an important part of an image obtained by observing the semiconductor device fabricated by the semiconductor device fabrication method according to the embodiment.

In addition, FIG. 5 indicates an important part of an image obtained by observing the semiconductor device fabricated by the semiconductor device fabrication method according to the embodiment.

FIG. 5 is an image by an optical microscope of an upper surface of the semiconductor substrate 110 over which the etched oxide film 131 is formed as a mask film as illustrated in, for example, FIG. 3B.

With the above semiconductor device fabrication method, the oxide film 130 and the thermal oxide film 120 formed over the semiconductor substrate 110 are etched and ions are implanted in the semiconductor substrate 110 in a high-temperature environment with the etched oxide film 131 as a mask. Furthermore, the thermal oxide film 121 has high adhesion to the semiconductor substrate 110. As a result, even if thermal stress is created due to the difference in linear expansion coefficient between the semiconductor substrate 110 and the oxide film 131, the oxide film 131 does not peel off the semiconductor substrate 110 or crack because the oxide film 131 is formed over the semiconductor substrate 110 with the thermal oxide film 121 therebetween. That is to say, the oxide film 131 functions as a mask film without any positional deviation from the position in which the oxide film 131 is formed over the semiconductor substrate 110. Therefore, by using the oxide film 131 as a mask film for ion implantation, the ions are properly implanted in the regions in which the ions are to be implanted.

Furthermore, because the thermal oxide film 120 is not a film formed over the semiconductor substrate 110, an interface between the thermal oxide film 121 and SiC of the semiconductor substrate 110 is clean. Accordingly, if electrodes are formed over conductive regions of the semiconductor substrate 110 after the removal of the thermal oxide film 121, good electrical bonding of the electrodes to the conductive regions of the semiconductor substrate 110 is realized.

According to the disclosed technique, a deterioration in the characteristics of a semiconductor device is prevented.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A semiconductor device fabrication method comprising:
    forming a thermal oxide film on a semiconductor substrate made of a wide-band-gap semiconductor by heating the wide-band-gap semiconductor in an atmosphere of oxygen, such that carbon atoms break from silicon atoms in a portion of the wide-band-gap semiconductor and oxygen atoms combine with the silicon atoms of the wide-band-gap semiconductor from which the carbon atoms break;
    forming an oxide film directly on the thermal oxide film, the oxide film formed by deposition or sputtering;
    forming a patterned mask film on the oxide film;
    etching the oxide film and the thermal oxide film, which serves as an adhesion film, with the mask film as a mask; and
    implanting ions in the semiconductor substrate in a high-temperature environment of 300° C. or more with the etched oxide film as a mask.

2. The semiconductor device fabrication method according to claim 1, wherein the wide-band-gap semiconductor is silicon carbide.

3. The semiconductor device fabrication method according to claim 1, wherein the forming of the thermal oxide film includes heating a front surface of the semiconductor substrate at a temperature of 700° C. or more and 1100° C. or less in the atmosphere of oxygen.

4. The semiconductor device fabrication method according to claim 3, wherein the adhesion film has a thickness of 2 nm or more and 100 nm or less.

5. The semiconductor device fabrication method according to claim 4, wherein the thickness of the adhesion film is 5 nm or more and 10 nm or less.

6. The semiconductor device fabrication method according to claim 1, wherein a total thickness of the adhesion film and the oxide film is 0.5 µm or more and 3 µm or less.

7. The semiconductor device fabrication method according to claim 1, wherein the semiconductor substrate has a thickness of 350 µm or more and 500 µm or less.

8. The semiconductor device fabrication method according to claim 1, wherein the semiconductor substrate has a diameter of 4 inches or more and 6 inches or less.

9. The semiconductor device fabrication method according to claim 1, wherein temperature in the high-temperature environment is 500° C. or more.

10. The semiconductor device fabrication method according to claim 1, wherein the oxide film is formed by chemical vapor deposition on directly a surface of the adhesion film.

* * * * *